United States Patent
Li

(10) Patent No.: US 12,300,688 B2
(45) Date of Patent: May 13, 2025

(54) CONFIGURABLE RANDOM-ACCESS MEMORY (RAM) ARRAY INCLUDING THROUGH-SILICON VIA (TSV) BYPASSING PHYSICAL LAYER

(71) Applicant: Shanghai Denglin Technologies Co. Ltd, Shanghai (CN)

(72) Inventor: Jianwen Li, Saratoga, CA (US)

(*) Notice: Subject to any disclaimer, the term of this patent is extended or adjusted under 35 U.S.C. 154(b) by 721 days.

(21) Appl. No.: 16/025,226

(22) Filed: Jul. 2, 2018

(65) Prior Publication Data
US 2020/0006306 A1 Jan. 2, 2020

(51) Int. Cl.
| | | |
|---|---|---|
| H01L 25/18 | (2023.01) | |
| G06F 30/398 | (2020.01) | |
| H01L 25/00 | (2006.01) | |
| H01L 25/065 | (2023.01) | |

(52) U.S. Cl.
CPC .......... *H01L 25/18* (2013.01); *H01L 25/0657* (2013.01); *H01L 25/50* (2013.01); *G06F 30/398* (2020.01); *H01L 2225/06541* (2013.01); *H01L 2225/06565* (2013.01)

(58) Field of Classification Search
None
See application file for complete search history.

(56) References Cited

U.S. PATENT DOCUMENTS

| | | | | |
|---|---|---|---|---|
| 8,097,956 B2* | 1/2012 | von Kaenel | ...... | H01L 23/49816 257/777 |
| 8,599,595 B1 | 12/2013 | Stephens, Jr. | | |
| 9,432,298 B1* | 8/2016 | Smith | ................. | H04L 49/9057 |
| 9,870,982 B2 | 1/2018 | Secker et al. | | |
| 9,972,611 B2 | 5/2018 | Pappu et al. | | |
| 2003/0159013 A1* | 8/2003 | Frank | .................. | G06F 13/1615 711/169 |
| 2009/0091962 A1* | 4/2009 | Chung | ..................... | G11C 5/02 365/51 |
| 2009/0237970 A1* | 9/2009 | Chung | ..................... | G11C 5/02 365/51 |
| 2010/0020583 A1* | 1/2010 | Kang | ....................... | G11C 5/02 365/51 |
| 2011/0084385 A1* | 4/2011 | Itaya | ..................... | H01L 21/563 257/737 |
| 2011/0084744 A1* | 4/2011 | Nishioka | .............. | G11C 7/1093 327/161 |

(Continued)

FOREIGN PATENT DOCUMENTS

| | | |
|---|---|---|
| CN | 104517938 A | 4/2015 |
| CN | 104541257 A | 4/2015 |

(Continued)

OTHER PUBLICATIONS

Chinese Application No. 201811073439.1, First Office Action mailed Dec. 24, 2020, 40 pages.

*Primary Examiner* — J. H. Hur
(74) *Attorney, Agent, or Firm* — Zhong Law, LLC

(57) ABSTRACT

A system comprising a main logic circuit comprising a memory controller comprising a signal control circuit and a through-silicon via (TSV) connection point electrically coupled to the signal control circuit, and a memory device comprising a memory unit comprising a TSV electrically coupled to the TSV connection point of the main logic circuit, wherein the signal control circuit is to transmit a signal using the TSV to operate the memory device.

20 Claims, 6 Drawing Sheets

(56) References Cited

U.S. PATENT DOCUMENTS

| | | | |
|---|---|---|---|
| 2011/0292742 A1* | 12/2011 | Oh | G11C 29/702 |
| | | | 365/189.05 |
| 2011/0309475 A1* | 12/2011 | Lee | G11C 5/025 |
| | | | 257/532 |
| 2012/0162836 A1* | 6/2012 | Furuta | H01L 23/62 |
| | | | 361/56 |
| 2012/0170345 A1* | 7/2012 | Choi | G11C 5/02 |
| | | | 365/51 |
| 2012/0272112 A1* | 10/2012 | Oh | H01L 23/481 |
| | | | 714/727 |
| 2017/0069601 A1 | 3/2017 | Park | |

FOREIGN PATENT DOCUMENTS

| | | |
|---|---|---|
| CN | 103828046 A | 5/2015 |
| CN | 104885212 A | 9/2015 |
| CN | 107564894 A | 1/2018 |

* cited by examiner

CONFIGURABLE RANDOM-ACCESS MEMORY (RAM) ARRAY INCLUDING THROUGH-SILICON VIA (TSV) BYPASSING PHYSICAL LAYER

TECHNICAL FIELD

The present disclosure relates to a random-access memory (RAM) device, and in particular, to a configurable RAM device including an array of memory units bonded to a main logic circuit using through-silicon via (TSV) to transmit signals, thus bypassing the memory physical layer.

BACKGROUND

Computing systems may include processing devices and memory devices. The computing systems can be desktop computers, laptop computers, tablet computers, smart phones etc. The processing devices can be central processing units (CPUs), graphic processing units (GPUs), or any suitable types of processing circuits. The memory devices are physical devices that are capable of storing data values temporarily or permanently. The memory devices can be random-access memory (RAM) devices including static RAM (SRAM) devices and dynamic RAM (DRAM) devices.

The RAM devices may include an array of cells to hold binary data values ("0" or "1"). An SRAM device employs a small static current to maintain the data values stored in the cells. A DRAM device employs switches and charged components (e.g., paired transistor and capacitor) to construct the cells that hold data values. Because of the charged components may slowly lose their power, the DRAM devices require periodical refresh (e.g., refreshing every 4 milliseconds). DRAM devices are less expensive than SRAM devices and are therefore widely used in computing systems.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
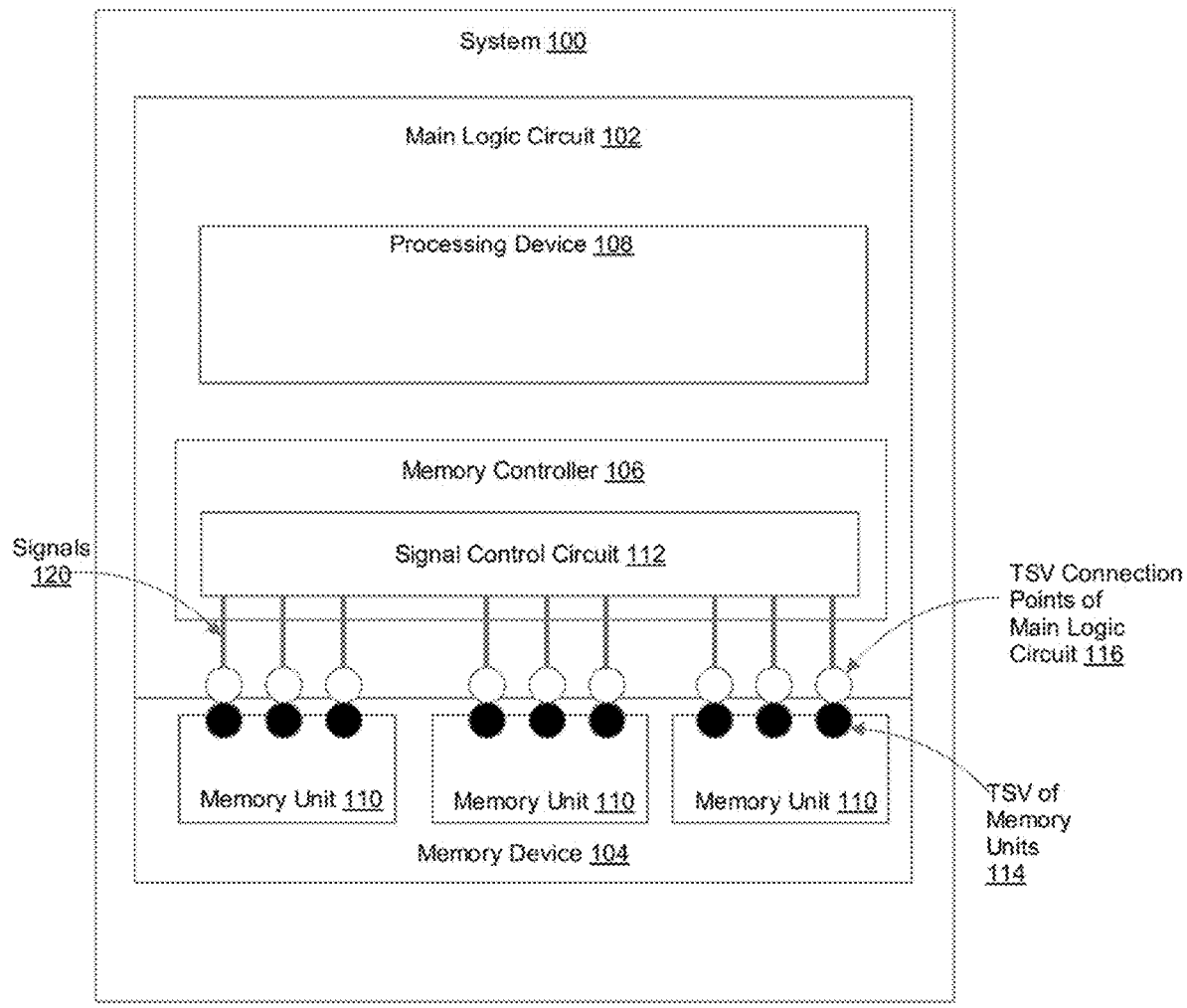
FIG. 1 illustrates a system including a memory controller coupled to a memory device using through-silicon via according to an implementation of the present disclosure.

DRAM devices can be purchased as commodity chips or custom chips. Commodity DRAM chips are manufactured in high volumes and sold as standard parts to the market. Commodity DRAM chips, however, provide limited selections in terms of configurations, capacities, and performance metrics. The configurations of DRAM devices may include the specification of physical dimensions such as, for example, lengths, widths, and depths of the DRAM chips. The capacity of a DRAM device may be specified according to the maximum amount of data that the DRAM device can hold. The performance metrics of the DRAM device may be specified according to the data transmission rate (bandwidth), data error rate etc. Examples of commodity DRAM chips can have the capacities of 4 giga bytes (Gbs), 8 Gbs, or 16 Gbs, the configurations with widths that are ×4, ×8, or ×16 times of the depths, and data transmission rate at 3.2 Gb/second. The operations of commodity DRAM chips may be controlled by double-data rate (DDR) interface (referred to as a DDR controller) designed according to the Joint Electron Device Engineering Council (JEDEC) standard.

Computer system commonly includes a memory controller and a memory physical layer interface (referred to as the "memory PHY") to control the access of the memory device such as, for example, a DRAM device or a synchronous DRAM (SDRAM) device. The memory controller may include circuits to exercise centralized control of accessing (reading/writing) the memory device and refreshing the DRAM for maintaining data stored in the charged components. The memory PHY commonly includes circuits for driving signals that govern operation of the memory device. For example, the memory PHY may provide signals for controlling read, write, erase, and refresh operations issued by the memory controller to the memory device, where these signals are issued to an input/output (I/O) buffer coupled to the memory device. Additionally, the memory PHY may operate at different operation points determined by the operation frequency and/or operating voltage of the memory PHY. For example, the memory PHY may receive a clock signal for governing the synchronization in the memory PHY and the memory controller, and may receive a reference voltage (VDD) for governing the voltage use by the memory PHY.

The memory controller may interact with the memory device through the memory PHY based on a memory interface standard such as, for example, the DDR PHY interface (DFI) protocol. The specification of the DFI protocol defines the interface protocol between the memory controller and the memory PHY, including signals, timing, functionalities needed for communicating with the memory PHY.

The memory PHY includes hardware circuits that implement an interface protocol (e.g., DFI) to facilitate the communication between the memory controller and the memory device which is a different chip. The memory PHY typically includes a combination of physical media (e.g., wires, cables) and special-purpose circuit to enable the transmissions through the physical media. Because the memory PHY is designed to operate with commodity memory chips according to the interface protocol, circuitry of the memory PHY is typically complex and large in terms of the physical size. The large physical size of the memory PHY can limit the data transmission rate (or the bandwidth) of the DRAM because each main logic circuit including the processing device and the memory controller can only accommodate a limited number (e.g., 4) of memory PHY interfaces due to their large size and power consumption. Furthermore, since the physical media of the memory PHY can also occupy a large physical area, the electrical performance can also deteriorate compared to transmitting data/ signals on the bare physical media (e.g., metal wires in silicon) without the memory PHY. Thus, the memory PHY may become a bottleneck in the design of a highspeed memory device.

Instead of passing through the memory PHY, implementations of the present disclosure may provide direct communication links between the memory controller and the memory device bypassing the memory PHY. In one implementation, each of the direct communication links is a through-silicon via (TSV) that is provided both to the main logic circuit (including the processing device and the memory controller) and to the memory device. A TSV is a vertical electrical connection (e.g., through a hole filled with conductive materials) that passes through one or more silicon layers (or dies) to electrically connect circuits fabricated on different silicon layers. The pitch of the TSV is typically very small (e.g., in the order of a few µm). The memory controller may employ the TSVs, without the intermediate layer of the memory PHY, to transmit signals to control the operation of the memory device. The elimination of the memory PHY as the intermediate layer may significantly reduce the size of the control circuit, thus reducing the power consumption. Because the pitches for the TSVs are very small (in the range of a few µm, a large number (e.g., 512×512) of TSV connection points can be packaged into one main logic circuit, thus significantly increasing the bandwidth. For example, with 64 bit DDR interface using four memory PHY interfaces running at 3.2 GHz data rate, the DRAM device may achieve 4×64×3.2=829.2 Gb bandwidth. However, with TSV direct data link interfaces, the main logic circuit may accommodate a 512×512 bus of TSV connection points. When running at 1 Ghz, the DRAM device may achieve 262,144 Gb which is much higher than the memory PHY interface.

Implementations of the disclosure may include a memory structure containing an array of memory units, where the memory structure may include a silicon layer (or die) in which memory units are fabricated. Each memory unit may include an array of cell circuits of charge components to hold a binary data value. The array of cell circuits may include a number of rows and a number of columns (e.g., 516 by 512) of cell circuits. Each memory unit may be fabricated to further include a set of through-silicon vias (TSVs) to transmit a corresponding set of signals. The set of signals can include data, addresses, timing signals, power control signals, and chipset-specific pre-defined signals. Each of the set of TSVs may include a TSV interconnect endpoint for connecting to a main logic circuit. The main logic circuit may include a memory controller to transmit the set of signals transmitted through TSVs to the array of memory units. Because the memory units can be standard and identical circuit parts, the memory units can be produced at a very high volume (e.g., more than 100 million pieces) and at very low costs.

A custom DRAM chip can be built using the memory units. The specification of the custom DRAM chip may define the physical configuration (e.g., physical dimensions), the capacity (e.g., 8 Gb), and the performance metrics (e.g., the bandwidth). Based on the specification, a design program may determine the number of memory units needed to meet the specification. A memory structure may be fabricated to include the determined number of memory units. The memory structure can be a layer of silicon including the determined number of memory units fabricated therein.

The memory structure can be bonded to a main logic circuit. The main logic circuit may correspondingly include an array of receptor areas (referred to as the "memory unit receptors") matching the array of memory units. Each of the memory unit receptors may be pre-configured with TSV connection points (e.g., interconnect balls) that match these TSV interconnect endpoints of the corresponding memory unit fabricated in the memory structure. Subsequent to the construction of the memory structure, a bond process is employed to bond the memory structure to the main logic circuit, where the main logic circuit may have been made in a separate and different process. After the bonding, the endpoints of the TSVs of the memory units are bonded to the TSV connection points on the main logic circuit. As a result, the memory units on the memory structure are electrically coupled to the main logic circuit through the TSVs. Because of the pitch of a TSV can be very small, a large number of TSVs can be employed to transmit data in parallel, thus increasing the bandwidth for transmitting the signals between the memory device and the processing devices on the main logic circuit.

In one implementation, the main logic circuit may provide a memory controller that is electrically coupled to the array of memory units using the TSVs. The memory controller may include input and output (I/O) circuit to provide an interface for connecting the array of memory units to the processing device of the computing system. Further, the memory controller may include signal control circuit to handle the signals received from the TSVs and use the signals to control the operation of the DRAM directly without passing through a memory PHY.

FIG. 1 illustrates a system 100 including a memory controller coupled to a memory device using through-silicon via according to an implementation of the present disclosure. System 100 can be a computing system such as, for example, a desktop computer, a laptop computer, a tablet computer, a smart phone, or any suitable types of computing devices. System 100 can also be a system-on-a-chip (SoC) fabricated on a silicon die. Referring to FIG. 1, system 100 may include a main logic circuit 102 and a memory device 104. Main logic circuit 102 may be a circuit board such as a printed circuit board (PCB) or an integrated circuit (IC) in which different circuit logics are implemented.

Main logic circuit 102 may further include processing devices 108 and a memory controller 106. Processing devices 108 can be hardware circuitry such as, for example, a central processing unit (CPU) or a graphic processing unit (GPU) that includes one or more processing cores to execute software applications. In one implementation, processing device 108 may include a basic input/output system (BIOS) (not shown) that can be implemented in hardware, firmware, software, or a combination thereof. At the initiation stage (e.g., power-on) of system 100, BIOS may run tests on the hardware components of system 100.

Memory controller 106 may include circuits to exercise centralized control of accessing (reading/writing) the memory device 104. In one implementation, memory controller 106 can be an independent logic circuit separate from processing device 108. In another implementation, memory controller 106 can be an integrated part of one of processing device 108 (e.g., a CPU). When memory device 104 is a DRAM, memory controller may also manage the refresh of the DRAM to maintain data stored in the charged components therein.

Memory device 104 is a hardware circuit that is capable of storing data values. In one implementation, memory device 104 may be a dynamic random-access memory (DRAM) device or a synchronous DRAM (SDRAM) device. In one implementation, memory device 104 may include one or more memory units 110. Each one of memory units 110 may include an array of data storage cells and an interface circuit. Each data storage cell in the array of a DRAM device may contain a charge component (e.g., a capacitor) for storing a binary value ("0" or "1") and a switch component (e.g., a transistor) for enabling the data storage cell. A data storage cell in an array may be identified according to a column identifier and a row identifier of the array. The interface circuit of memory units 110 may include a column decoder, a row decoder, buffers, and refresh amplifiers. The column decoder and the row decoder may decode a memory address received from the memory controller into the column identifier and the row identifier (and a layer identifier if the memory includes 3D stacked silicon layers) to access the data storage cell referenced by the memory address. Buffers may include one or more address buffers to receive the addresses from memory controller 106, one or more data buffers to store data values, an operation flag buffer to store the type of operations (e.g., "Read" or "Write").

The addresses (including column identifiers, row identifiers, and layer identifiers), data values, and operation flags are collectively referred to as signals 120 provided by memory controller 106. Signals 120 may also include the positive and negative power supplies (Vdd, Vss), a refresh enable signal etc. Memory controller 106 may use these signals to control operations of memory device 104.

Instead of providing these signals through a memory PHY (which can occupy a large circuit and physical media area, and limit the bandwidth), implementations of the present disclosure may use through-silicon via (TSV) to provide these signals directly from memory controller 106 to memory units 110 in memory devices 104 bypassing a memory PHY. In one implementation, main logic circuit 102 does not include an implementation of the memory PHY. In another implementation, main logic circuit 102 may include an implementation of the memory PHY. In either scenarios, however, memory controller 106 provides signals 120 to memory units 110 directly without passing through the intermediate memory PHY.

In one implementation, memory controller 106 may include a signal control circuit 112 for providing and managing these signals 120. Because signal control circuit 112 is implemented as part of memory controller 106, signal control circuit 112 does not occupy additional circuit areas for implementing the memory PHY, thus reducing the footprint of the main logic circuit 102. Signal control circuit 112 may implement drivers to dispatch these signals to memory units 110. Since the electrical property of TSV connections is substantially similar to metal wires in silicon chips, the known interface specification can be implemented in the memory controller, thus eliminating the need for a memory PHY between the memory controller and the memory device. This allows for the design of the memory controller to work with custom DRAM devices.

In one implementation, memory units 110 may be fabricated with TSVs 114 and similarly, main logic circuit 102 may be fabricated with TSV connection points 116 that correspondingly match TSVs 114 of memory units 110. Memory units 110 can be fabricated by one process while main logic circuit 112 can be fabricated by another process. In a subsequent bonding step, TSVs 114 of memory units 110 may be aligned with TSV connection points 116 of main logic circuit. TSVs 114 and their corresponding counterpart TSV connection points 116 are electrically connected when they are bonded together in the bonding processing. When they are bonded together, memory units 110 of memory device 104 are electrically connected to signal control circuit 112 of memory controller 106 without utilizing the memory PHY. The electrical connection using TSVs 114, 146 allows memory controller 106 to directly interact with memory units 110 and transmit data at a very high bandwidth.

Figure 2:
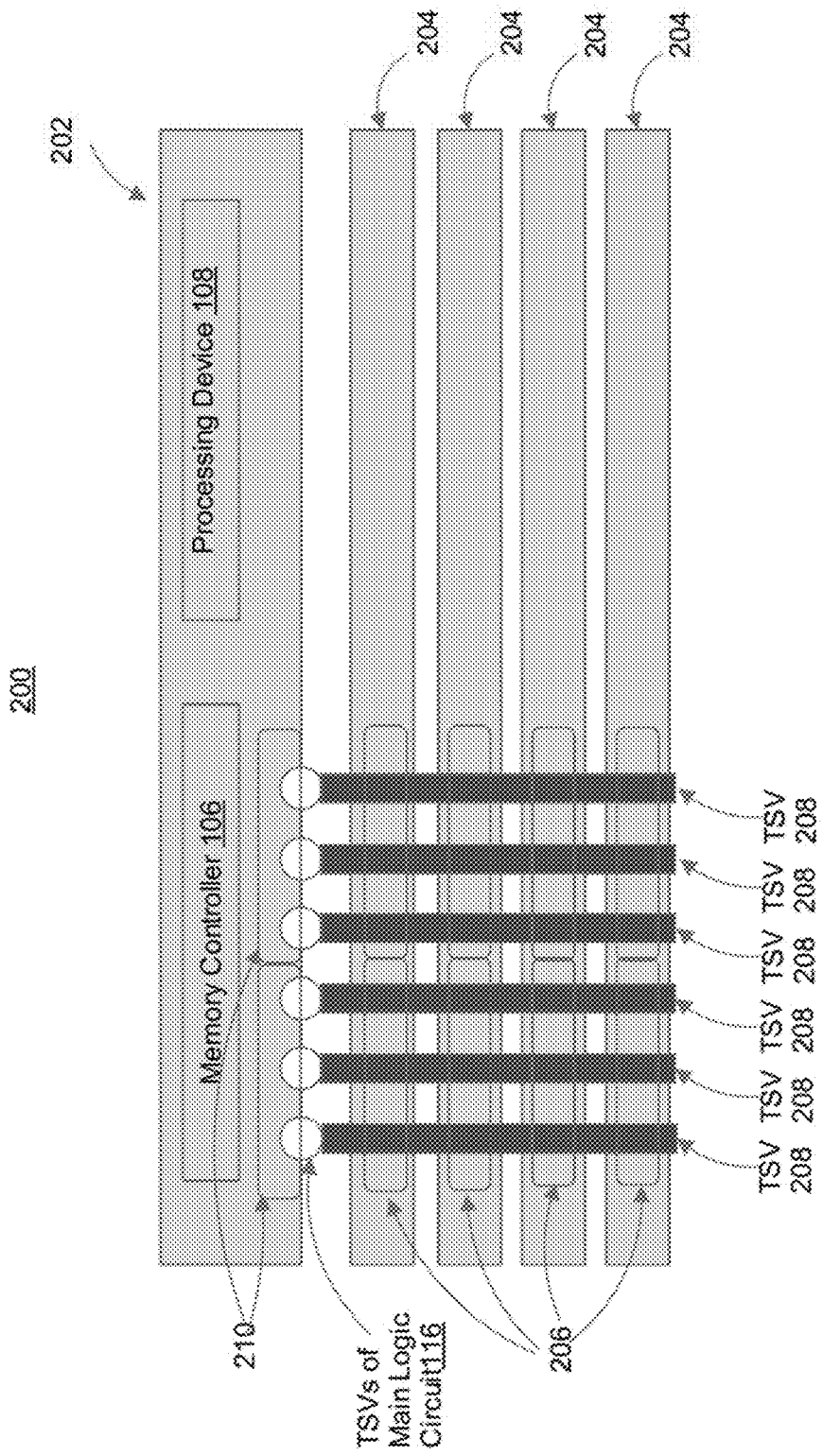
FIG. 2 illustrates a cross-section view of a system including main logic circuit 3D-stacked with one or more memory structures according to an implementation of the present disclosure.

In one implementation, the main logic circuit and one or more memory units are vertically bonded together using 3D stacking. FIG. 2 illustrates a cross-section view of a system 200 including main logic circuit 3D-stacked with one or more memory structures according to an implementation of the present disclosure. As shown in FIG. 2, a silicon layer 202 may implement the circuitry of memory controller 106 and processing devices 108. System 200 may further include memory structures 204 that are vertically stacked together with the silicon layer 202 of the main logic circuit. Each memory structure 204 may include a silicon layer (or die) in which one or more memory units 206 may be fabricated.

Memory controller 106 may include a signal control circuit to use signals as discussed above to access and operate memory unit 206. When silicon layer 206 of main logic circuit is bonded with memory structures 204, memory controller 106 is electrically connected to memory units 206 using TSVs 208. In operation, memory controller 106 may use TSVs to provide signals to memory units 206 in different layers, where a cell in a memory unit 106 is identified by a column identifier signal, a row identifier signal, and a layer identifier signal.

Figure 3:
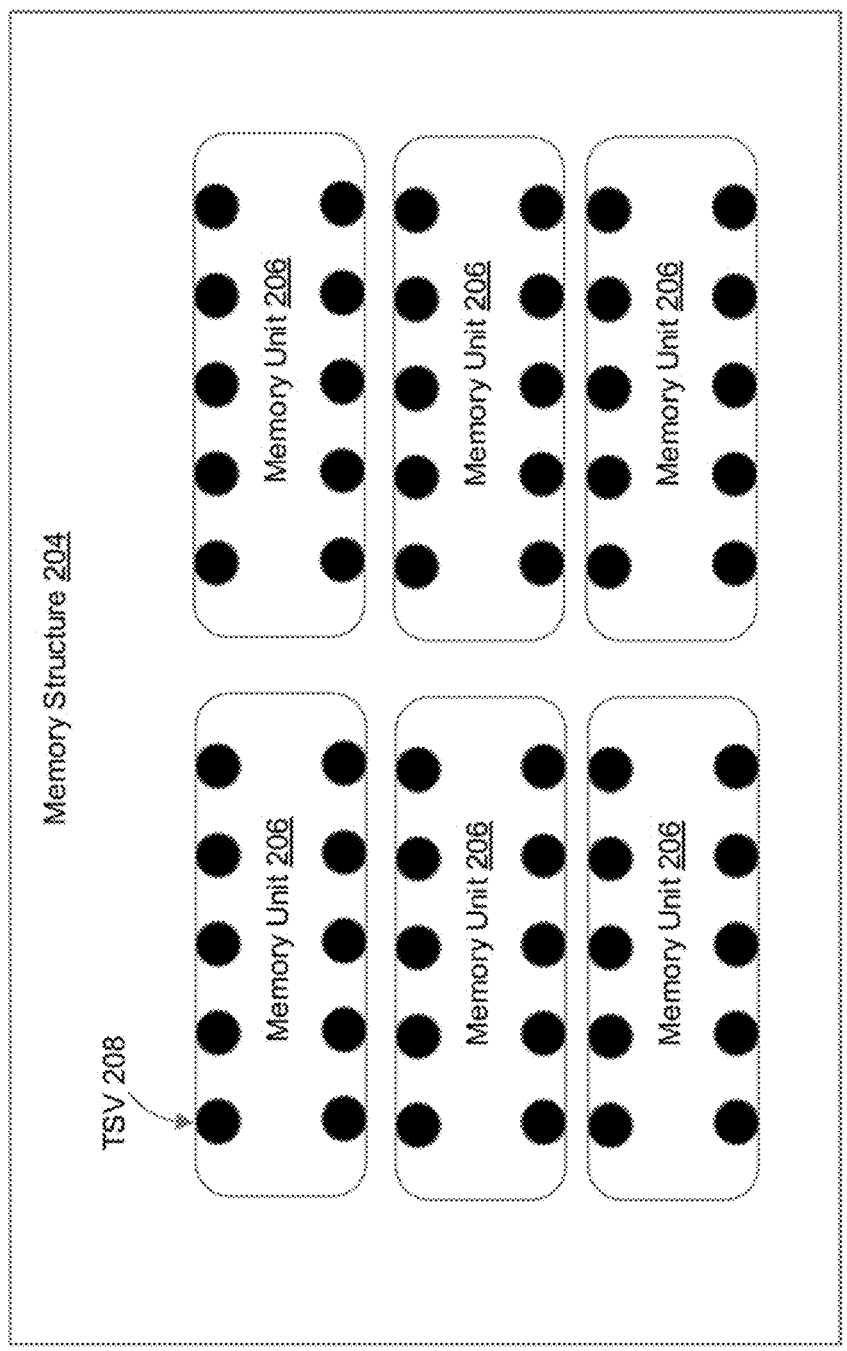
FIG. 3 illustrates a top (or bottom) view of a memory structure including memory units according to an implementation of the present disclosure.
Figure 4:
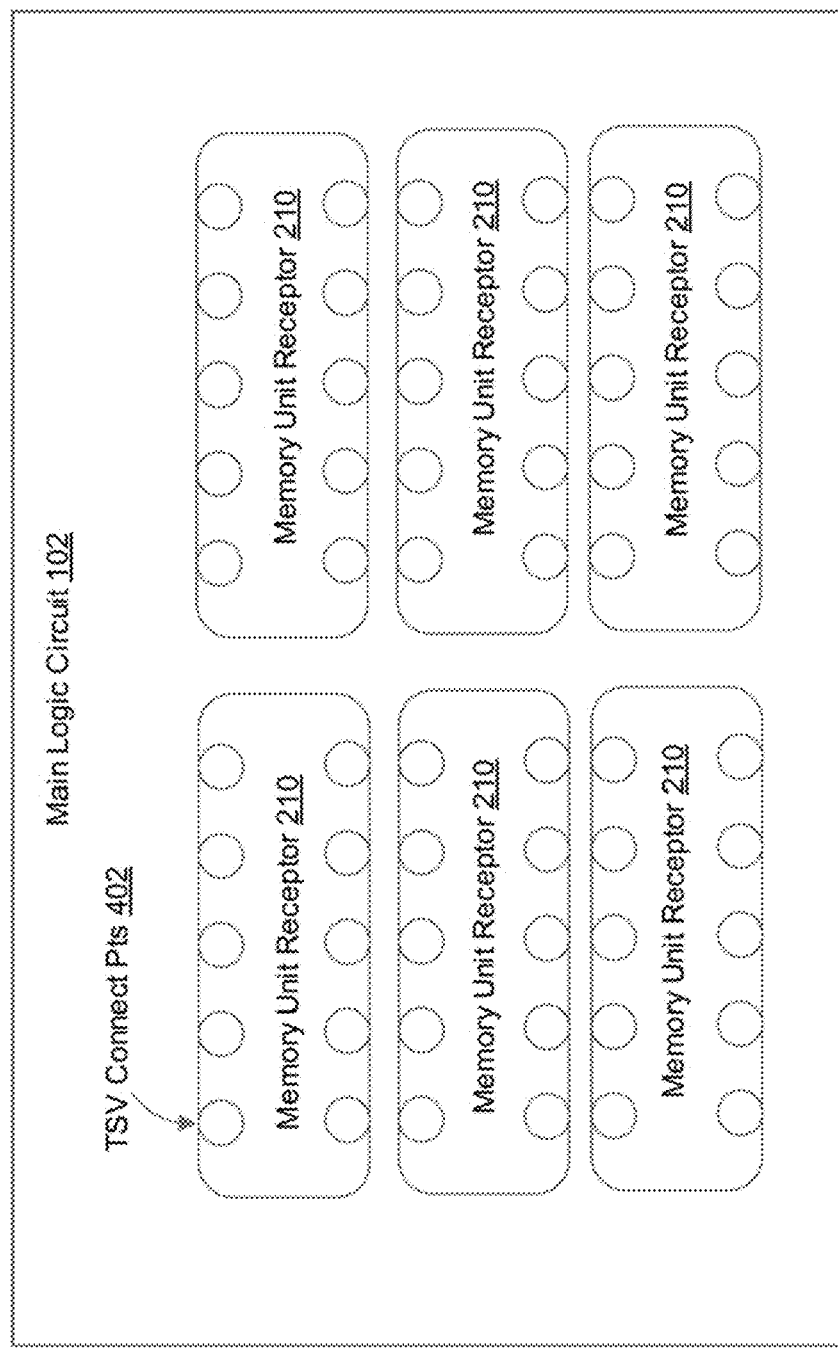
FIG. 4 illustrates a bottom (or top) view of main logic circuit including matching memory unit receptors according to an implementation of the present disclosure.

Each memory structure layer 204 may include a number of memory units 206, and similarly, main logic circuit 120 may include a corresponding number of memory unit receptors matching the number of memory units. FIG. 3 illustrates a top (or bottom) view of a memory structure 204 including memory units 206 according to an implementation of the present disclosure. FIG. 4 illustrates a bottom (or top) view of main logic circuit 102 including matching memory unit receptors 210 according to an implementation of the present disclosure. Referring to FIG. 3, a silicon layer of a memory structure 204 may include a number of memory units 206. Each memory unit 206 may include TSVs 208 for receiving signals from and dispatching signals to signal control circuit 112 of memory controller 106. Referring to FIG. 4, main logic circuit 102 may correspondingly include memory unit receptors 206. Each memory unit receptor 210 is a circuit area including TSV connection points 402. When memory structure 204 is bonded to main logic circuit 102, memory units 206 are aligned and coupled to memory unit receptors 210 (and TSVs 208 are coupled to TSV connection points 402), thus allowing signal control circuit 106 to transmit signals to and from memory units 206.

Memory structure 204 may be fabricated to include a select number of memory units 206. A system design may specify the capacity and performance metric of the DRAM memory therein. The specification may deviate from commodity DRAM specification and therefore may require custom DRAM chips to meet its configuration, capacity, and performance requirements. For example, the product design may call for a certain capacity and a very high bandwidth. In such situation, a processing device may execute a design program to determine the number of memory units 206 needed to meet the capacity specification, and further determine the number of memory structure layers based on the determined number of memory units and the number of memory unit receptors on the main logic circuit. For example, if the main logic circuit includes 512 memory unit receptors and each memory units is designed to hold one megabytes of data, the design program may determine that two layers of memory structures are needed for a system designed to include one gigabytes of DRAM.

Although FIG. 4 illustrates that main logic circuit 102 includes identical, uniformly distributed memory unit receptors 210, it is understood that the implementation may also include different types of memory unit receptors 210, or non-uniformly distributed memory unit receptors 210, or the combination thereof. For example, main logic circuit 102 may include a first set of memory unit receptors designed to be coupled to one megabyte memory units and a second set of memory unit receptors designed to be coupled to two megabyte memory units. The memory unit receptors can be geographically distributed on the board of the main logic circuit 102 uniformly or non-uniformly. The choices of different types of memory unit receptors and distributions provide the flexibility to fabricate different systems without changing the main logic circuit 102, thus reducing the cost to build a custom system.

Figure 5:
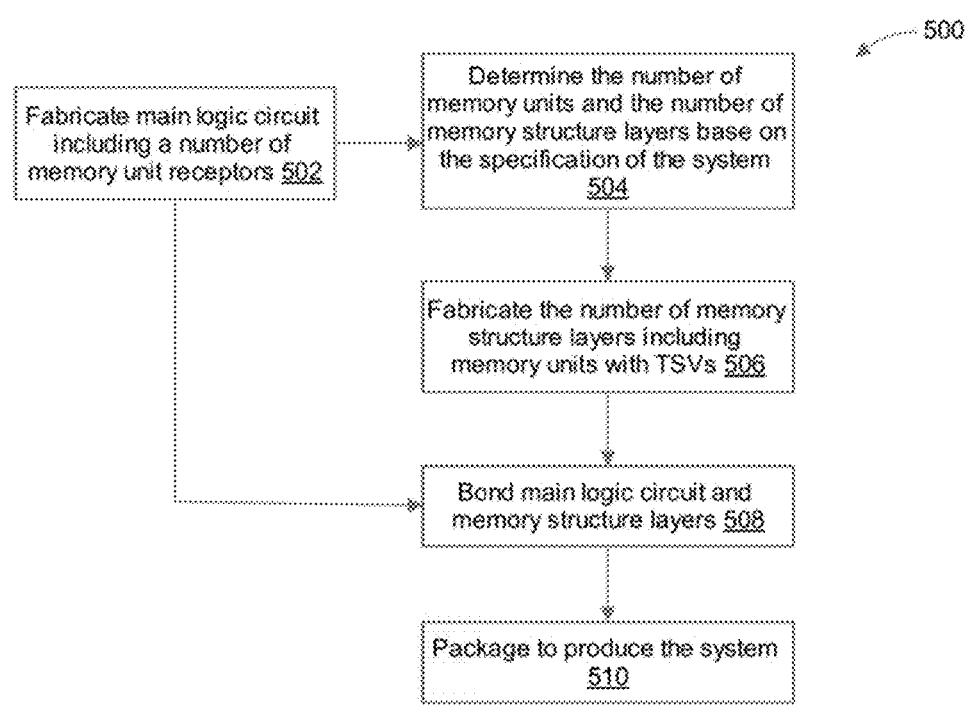
FIG. 5 depicts a flow diagram of a method for fabricating a system using 3D stack technology according to an implementation of the present disclosure.

As such, a DRAM device may be packaged with the main logic circuit on an integrated circuit (IC) using three-dimensional (3D) stack technology. The 3D stacking may stack layers of silicon wafers (or dies) and interconnect the stacked silicon wafers vertically. The main logic circuit may transmit signals to DRAM using TSVs. FIG. 5 depicts a flow diagram of a method 500 for fabricating a system using 3D stack technology according to an implementation of the present disclosure. Method 500 may be controlled by processing devices of a semiconductor fabrication plant (FAB) that may comprise hardware (e.g., circuitry, dedicated logic), computer readable instructions (e.g., run on a general purpose computer system or a dedicated machine), or a combination of both. Method 500 and each of its individual functions, routines, subroutines, or operations may be performed by one or more processors of the computer device executing the method. In certain implementations, method 500 may be controlled by a single processing thread. Alternatively, method 500 may be controlled by two or more processing threads, each thread executing one or more individual functions, routines, subroutines, or operations of the method.

For simplicity of explanation, the methods of this disclosure are depicted and described as a series of acts. However, acts in accordance with this disclosure can occur in various orders and/or concurrently, and with other acts not presented and described herein. Furthermore, not all illustrated acts may be needed to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term "article of manufacture," as used herein, is intended to encompass a computer program accessible from any computer-readable device or storage media. In one implementation, method 200 may be controlled by a processing device of a FAB.

Referring to FIG. 5, at 502, the FAB may be operated to fabricate a main logic circuit. The main logic circuit may include one or more processing devices associated with a memory controller. The memory controller may include a signal control circuit for generating and transmitting signals to a memory device. Further, the FAB may be operated to fabricate the main logic circuit with a pre-determined number of memory unit receptors. Each memory unit receptors may be fabricated with a set of TSV connection points corresponding to a set of signals used to operate the DRAM device. The set of TSV connection points may be electrically connected to the signal control circuit bypassing the memory PHY (or without passing through the memory PHY).

At 504, a processing device of the FAB may determine the number of memory units and the number of memory structure layers based on the specification of the system. The specification may define the DRAM capacity and performance metrics. The processing device of the FAB may calculate the number of memory units needed based on the capacity per memory unit, and further calculate the number of memory structure layers needed based on the number of memory unit receptors associated with the main logic circuit and the number of memory units needed.

At 506, the FAB may be operated to fabricate the determined number of memory structure layers, each layer including a number of memory units matching the memory unit receptors associated with the main logic circuit. The fabrication of a memory structure layer may include fabricating memory units on a silicon die at locations matching the locations of memory unit receptors on the main logic circuit and aligning of the TSVs associated with these memory units with the TSV connection points of the main logic circuit.

The FAB (or a different FAB) may be operated to fabricate memory units of a certain capacity (e.g., 1 Mb, 2 Mb, etc.). This fabrication process may include designing and generating a photomask for the memory units. The photomask is used to, in the fabrication, to produce the circuitry of the memory units. The fabrication process may further include photolithography where a wafer may be exposed to photolithographic lights subject to the photomask. The photomask is used to define the circuitry and connector of the memory units. The circuitry of the memory units may include the array of cells to store data values and the interface circuit associated with the memory units, where the interface circuit may include connection points for transmitting signals. In practice, due to the design and verification process, the photomask can be very expensive to produce. Implementations of the disclosure, however, allow for repeated use of the same photomask to fabricate high volume of memory units, thus significantly reducing the cost to produce the DRAM device.

The FAB may also be operated to fabricate TSVs in memory units for transmitting signals. In one implementation, the TSVs may be fabricated prior to the fabrication of the circuitry of a memory unit. In another implementation, the TSVs are fabricated after the circuitry of the memory units is fabricated but before fabrication of the metal layer for connecting the components in the memory units. In yet another implementation, the TSVs are fabricated after the metal layer is fabricated.

At 508, the FAB may be operated to bond the main logic circuit and the memory structure layers including memory units with TSVs. The bonding may include aligning the TSVs in these memory structure layers with the TSV connection points of the main logic circuit. After the bonding, the signal control circuit of the memory controller in the main logic circuit is electrically connected the memory units using the TSVs to transmit signals.

At 510, the FAB may be operated to package the system including the main logic circuit and the determined number of memory structure layers including memory units with TSVs. The packaging may include encapsulating the system into individual package as the final product. Because of employing TSVs and memory units that can be manufactured at a very low cost, a high-performance system with a customized DRAM device can be produced at a low production cost.

The following examples pertaining further embodiments. Example 1 is a system comprising a main logic circuit comprising a memory controller comprising a signal control circuit and a through-silicon via (TSV) connection point electrically coupled to the signal control circuit, and a memory device comprising a memory unit comprising a TSV electrically coupled to the TSV connection point of the main logic circuit, wherein the signal control circuit is to transmit a signal using the TSV to operate the memory device.

Example 2 is a memory device comprising a memory structure comprising a memory unit, the memory unit comprising a through-silicon via (TSV) coupled to a TSV connection point of a main logic circuit, wherein a signal control circuit of the main logic is to transmit a signal using the TSV to operate the memory device.

Example 3 is a method comprising fabricating a main logic circuit comprising a memory controller and a pre-determined number of memory unit receptors, fabricating a plurality of memory units, each comprising a plurality of through-silicon vias (TSVs), determining, by a processing device based on a system specification, a number of memory structures, wherein each memory structure is to hold the pre-determined number of memory units, and bonding the determined number of memory structures to the main logic circuit by matching the pre-determined number of memory units to the pre-determined number of memory unit receptors, forming, using the plurality of TSVs, signal paths between the memory controller and the plurality of memory units bypassing a memory physical layer.

Figure 6:
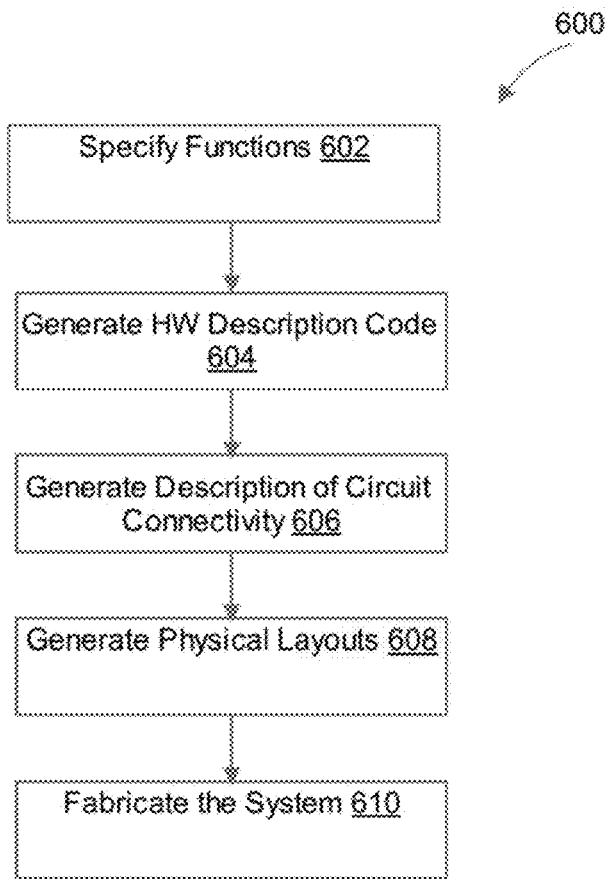
FIG. 6 is a flow diagram illustrating a method for the design and fabrication of an IC device implementing one or more aspects in accordance with some embodiments.

FIG. 6 is a flow diagram illustrating a method 600 for the design and fabrication of an IC device implementing one or more aspects in accordance with some embodiments. As noted above, the code generated for each of the following processes is stored or otherwise embodied in non-transitory computer readable storage media for access and use by the corresponding design tool or fabrication tool.

At block 602, a processing device may specify functions for an IC device. The functions (often referred to as a micro architecture specification (MAS)) may be represented by any of a variety of programming languages or modeling languages, including C, C++, System C, Simulink, or MAT-LAB.

At block 604, the functional specification is used to generate hardware description code representative of the hardware of the IC device. In some embodiments, the hardware description code is represented using at least one Hardware Description Language (HDL), which comprises any of a variety of computer languages, specification languages, or modeling languages for the formal description and design of the circuits of the IC device. The generated HDL code typically represents the operation of the circuits of the IC device, the design and organization of the circuits, and tests to verify correct operation of the IC device through simulation. Examples of HDL include Analog HDL (AHDL), Verilog HDL, System Verilog HDL, and VHDL. For IC devices implementing synchronized digital circuits, the hardware descriptor code may include register transfer level (RTL) code to provide an abstract representation of the operations of the synchronous digital circuits. For other types of circuitry, the hardware descriptor code may include behavior-level code to provide an abstract representation of the circuitry's operation. The HDL model represented by the hardware description code typically is subjected to one or more rounds of simulation and debugging to pass design verification.

After verifying the design represented by the hardware description code, at block 606 a synthesis tool is used to synthesize the hardware description code to generate code representing or defining an initial physical implementation of the circuitry of the IC device. In some embodiments, the synthesis tool generates one or more netlists comprising circuit device instances (e.g., gates, transistors, resistors, capacitors, inductors, diodes, etc.) and the nets, or connections, between the circuit device instances. Alternatively, all or a portion of a netlist can be generated manually without the use of a synthesis tool. As with the hardware description code, the netlists may be subjected to one or more test and verification processes before a final set of one or more netlists is generated.

Alternatively, a schematic editor tool can be used to draft a schematic of circuitry of the IC device and a schematic capture tool then may be used to capture the resulting circuit diagram and to generate one or more netlists (stored on a computer readable media) representing the components and connectivity of the circuit diagram. The captured circuit diagram may then be subjected to one or more rounds of simulation for testing and verification.

At block 608, one or more EDA tools use the netlists produced at block 606 to generate code representing the physical layout of the circuitry of the IC device. This process can include, for example, a placement tool using the netlists to determine or fix the location of each element of the circuitry of the IC device. Further, a routing tool builds on the placement process to add and route the wires needed to connect the circuit elements in accordance with the netlist (s). The resulting code represents a three-dimensional model of the IC device. The code may be represented in a database file format, such as, for example, the Graphic Database System II (GDSII) format. Data in this format typically represents geometric shapes, text labels, and other information about the circuit layout in hierarchical form.

At block 610, the physical layout code (e.g., GDSII code) is provided to a manufacturing facility, which uses the physical layout code to configure or otherwise adapt fabrication tools of the manufacturing facility (e.g., through mask works) to fabricate the IC device. That is, the physical layout code may be programmed into one or more computer systems, which may then control, in whole or part, the operation of the tools of the manufacturing facility or the manufacturing operations performed therein.

The methods, components, and features described herein may be implemented by discrete hardware components or may be integrated in the functionality of other hardware components such as ASICS, FPGAs, DSPs or similar devices. In addition, the methods, components, and features may be implemented by firmware modules or functional circuitry within hardware devices. Further, the methods, components, and features may be implemented in any combination of hardware devices and computer program components, or in computer programs.

Unless specifically stated otherwise, terms such as "receiving," "associating," "determining," "updating" or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and may not have an ordinal meaning according to their numerical designation.

Examples described herein also relate to an apparatus for performing the methods described herein. This apparatus may be specially constructed for performing the methods described herein, or it may comprise a general purpose computer system selectively programmed by a computer program stored in the computer system. Such a computer program may be stored in a computer-readable tangible storage medium.

The methods and illustrative examples described herein are not inherently related to any particular computer or other apparatus. Various general purpose systems may be used in accordance with the teachings described herein, or it may prove convenient to construct more specialized apparatus to perform method 300 and/or each of its individual functions, routines, subroutines, or operations. Examples of the structure for a variety of these systems are set forth in the description above.

The above description is intended to be illustrative, and not restrictive. Although the present disclosure has been described with references to specific illustrative examples and implementations, it will be recognized that the present disclosure is not limited to the examples and implementations described. The scope of the disclosure should be determined with reference to the following claims, along with the full scope of equivalents to which the claims are entitled.

What is claimed is:

1. A system comprising:
   a memory controller implemented on a circuit chip that is without any memory physical layer interface (memory PHY) therein, the memory controller comprising:
      a signal control circuit; and
      a through-silicon via (TSV) connection point electrically coupled to the signal control circuit, wherein the TSV connection point and the memory controller are packaged into a main logic circuit comprising the memory controller; and
   a memory device comprising a memory unit comprising a TSV electrically coupled to the TSV connection point, wherein the signal control circuit is to transmit a signal using the TSV directly to the memory device without utilizing any interface protocol provided by any memory PHY.

2. The system of claim 1, wherein the signal control circuit is to transmit a plurality of signals using a plurality of TSVs to the memory unit without using any memory PHY, wherein the plurality of TSVs comprises the TSV.

3. The system of claim 2, wherein the plurality of signals comprise at least one of an address signal, a data signal, an operation flag signal, or a power reference signal.

4. The system of claim 1, further comprising:
   a memory structure layer comprising a plurality of memory units comprising the memory unit, wherein the main logic circuit further comprises a plurality of memory unit receptors correspondingly match the plurality of memory units.

5. The system of claim 4, wherein each one of the plurality of memory units comprises a plurality of TSVs that are coupled to a plurality of TSV connection points of a respective corresponding memory unit receptor in the main logic circuit, wherein the plurality of TSVs comprises the TSV, and wherein the signal control circuit is to use the plurality of TSVs to transmit a plurality of signals to the memory unit.

6. The system of claim 1, further comprising:
   a plurality of memory structure layers, each comprising a plurality of memory units, wherein each one of the plurality of memory units comprises a plurality of TSVs, and wherein the plurality of memory structure layers are bonded to the main logic circuit to electrically couple the plurality of memory units to the signal control circuit using the plurality of TSVs of the corresponding memory unit.

7. The system of claim 1, wherein the memory device is at least one of a dynamic random-access memory, a synchronous dynamic random-access memory, or a static random-access memory.

8. The system of claim 1, further comprising a processing device communicatively coupled to the memory controller, wherein the processing device is at least one of a central processing unit or a graphic processing unit.

9. The system of claim 1, wherein the main logic circuit is fabricated using a first fabrication process, and the memory unit is fabricated using a second fabrication process, and wherein the first fabrication process is independent from the second fabrication process.

10. A processing device, comprising:
    a memory controller implemented on a circuit chip that is without any memory physical layer interface (memory PHY) therein; and
    a memory structure comprising a memory unit, the memory unit comprising a through-silicon via (TSV) coupled to a TSV connection point of the memory controller, wherein the TSV connection point and the memory controller are packaged into a main logic circuit comprising the memory controller, wherein the TSV connection point is electrically coupled to a signal control circuit of the memory controller, and wherein the signal control circuit of the memory controller is to transmit a signal using the TSV directly to the TSV connection point to operate the memory device without utilizing any interface protocol provided by any memory PHY.

11. The processing device of claim 10, wherein the memory controller comprises the signal control circuit.

12. The processing device of claim 10, wherein the signal control circuit is to transmit a plurality of signals using a plurality of TSVs to the memory unit without using any memory PHY, and wherein the plurality of signals comprise at least one of an address signal, a data signal, an operation flag signal, or a power reference signal.

13. The processing device of claim 10,
    wherein the memory device further comprises a memory structure layer comprising a plurality of memory units comprising the memory unit, wherein the main logic circuit further comprises a plurality of memory unit receptors correspondingly match the plurality of memory units.

14. The processing device of claim 13, wherein each one of the plurality of memory units comprises a plurality of TSVs that are coupled to a plurality of TSV connection points of a corresponding memory unit receptor in the main logic circuit, wherein the plurality of TSVs comprises the TSV, and wherein the signal control circuit is to use the plurality of TSVs to transmit a plurality of signals to the memory unit.

15. The processing device of claim 10,
    wherein the memory device further comprises a plurality of memory structure layers, each comprising a plurality of memory units, wherein each one of the plurality of memory units comprises a plurality of TSVs, and wherein the plurality of memory structure layers are bonded to the main logic circuit to electrically couple the plurality of memory units to the signal control circuit using the plurality of TSVs of the corresponding memory unit.

16. The processing device of claim 10, wherein the memory device is at least one of a dynamic random-access memory, a synchronous dynamic random-access memory, or a static random-access memory.

17. A method comprising:
fabricating in a first fabrication process a main logic circuit comprising a memory controller, wherein the main logic circuit is without a memory physical layer interface (memory PHY) therein, and the memory controller comprises a pre-determined number of memory unit receptors;
fabricating in a second fabrication process a plurality of memory units, each comprising a plurality of through-silicon vias (TSVs), wherein the first fabrication process is independent from the second fabrication process;
determining, by a processing device based on a system specification, a number of memory structures, wherein each memory structure is to hold the pre-determined number of memory units; and
bonding the determined number of memory structures to the main logic circuit by matching the pre-determined number of memory units to the pre-determined number of memory unit receptors, forming, using the plurality of TSVs, signal paths between the memory controller and the plurality of memory units without using any memory PHY.

18. The method of claim 17, further comprising:
operating the memory controller to transmit, using the plurality of TSVs, a plurality of signals to the pre-determined number of memory units.

19. The method of claim 18, wherein the plurality of signals comprise at least one of an address signal, a data signal, an operation flag signal, or a power reference signal.

20. The method of claim 17, wherein the plurality of TSVs in each one of the plurality of memory units are coupled to a plurality of TSV connection points of a corresponding memory unit receptor in the main logic circuit, and wherein a signal control circuit is to use the plurality of TSVs to transmit a plurality of signals to the memory unit.

* * * * *